United States Patent
Gouk et al.

(10) Patent No.: US 11,454,884 B2
(45) Date of Patent: Sep. 27, 2022

(54) FLUOROPOLYMER STAMP FABRICATION METHOD

(71) Applicant: Applied Materials, Inc., Santa Clara, CA (US)

(72) Inventors: Roman Gouk, San Jose, CA (US); Jean Delmas, Santa Clara, CA (US); Steven Verhaverbeke, San Francisco, CA (US); Chintan Buch, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 85 days.

(21) Appl. No.: 16/849,393

(22) Filed: Apr. 15, 2020

(65) Prior Publication Data

US 2021/0325776 A1 Oct. 21, 2021

(51) Int. Cl.
*G03F 7/00* (2006.01)
*H01L 21/027* (2006.01)
*H01L 21/768* (2006.01)

(52) U.S. Cl.
CPC ........ *G03F 7/0002* (2013.01); *H01L 21/0274* (2013.01); *H01L 21/76817* (2013.01)

(58) Field of Classification Search
CPC ............... G03F 7/0002; H01L 21/0274; H01L 21/76817; H01L 21/311
USPC ........................... 438/637; 264/293; 425/150
See application file for complete search history.

(56) References Cited

U.S. PATENT DOCUMENTS

| 4,073,610 A | 2/1978 | Cox |
| 5,126,016 A | 6/1992 | Glenning et al. |
| 5,268,194 A | 12/1993 | Kawakami et al. |
| 5,353,195 A | 10/1994 | Fillion et al. |
| 5,367,143 A | 11/1994 | White, Jr. |

(Continued)

FOREIGN PATENT DOCUMENTS

| CA | 2481616 C | 1/2013 |
| CN | 1971894 A | 5/2007 |

(Continued)

OTHER PUBLICATIONS

Allresist Gmbh—Strausberg et al: "Resist-Wiki: Adhesion promoter HMDS and diphenylsilanedio (AR 300-80)— . . . —Allresist GmbH—Strausberg, Germany", Apr. 12, 2019 (Apr. 12, 2019), XP055663206, Retrieved from the Internet: URL:https://web.archive.org/web/20190412 20micals-adhesion-promoter-hmds-and-diphenyl2908/https://www.allresist.com/process-chemicals-adhesion-promoter-hmds-and-diphenylsilanedio/, [retrieved on Jan. 29, 2020].

(Continued)

*Primary Examiner* — Caleen O Sullivan
(74) *Attorney, Agent, or Firm* — Patterson + Sheridan, LLP

(57) ABSTRACT

An imprint lithography stamp includes a stamp body having a patterned surface and formed from a fluorinated ethylene propylene copolymer. The imprint lithography stamp further includes a backing plate with a plurality of through-holes with portions of the stamp body extending into the through-holes to adhere the stamp body to the backing plate. The patterned surface of the stamp body has a plurality of protrusions extending from the stamp body, which are used to form high aspect ratio features at high processing temperatures. A mold design for forming the imprint lithography stamp and an injection molding process for forming the imprint lithography stamp are also provided.

20 Claims, 8 Drawing Sheets

(56) References Cited

U.S. PATENT DOCUMENTS

| | | |
|---|---|---|
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,134,687 B1 | 11/2018 | Kim et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |

(56) References Cited

U.S. PATENT DOCUMENTS

| | | | |
|---|---|---|---|
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2007/0290300 A1 | 12/2007 | Kawakami |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1* | 5/2008 | Ghoshal ............... B82Y 10/00 427/532 |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0204505 A1 | 8/2011 | Pagaila et al. |
| 2011/0259631 A1 | 10/2011 | Rumsby |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1* | 5/2012 | Takei ............... G03F 7/11 522/170 |
| 2012/0146209 A1 | 6/2012 | Hu et al. |
| 2012/0164827 A1 | 6/2012 | Rajagopalan et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1* | 8/2013 | Reed ............... H01L 21/6835 257/E21.531 |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0255344 A1 | 9/2015 | Ebefors et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0116057 A1 | 4/2018 | Kajihara et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1* | 12/2018 | Chen ............... H01L 21/561 |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |
| 2020/0357947 A1 | 11/2020 | Chen et al. |
| 2020/0358163 A1 | 11/2020 | See et al. |
| 2021/0005550 A1 | 1/2021 | Chavali et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 102437110 A | 5/2012 |
| CN | 104637912 A | 5/2015 |
| CN | 105436718 A | 3/2016 |
| CN | 106531647 A | 3/2017 |
| CN | 106653703 A | 5/2017 |
| CN | 107428544 A | 12/2017 |
| CN | 108028225 A | 5/2018 |
| CN | 109155246 A | 1/2019 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |

(56) References Cited

FOREIGN PATENT DOCUMENTS

| | | | |
|---|---|---|---|
| JP | 2001244591 A | 9/2001 | |
| JP | 2002208778 A | 7/2002 | |
| JP | 2002246755 A | 8/2002 | |
| JP | 2003188340 A | 7/2003 | |
| JP | 2004311788 A | 11/2004 | |
| JP | 2004335641 A | 11/2004 | |
| JP | 4108285 B2 | 6/2008 | |
| JP | 2012069926 A | 4/2012 | |
| JP | 5004378 B2 | 8/2012 | |
| JP | 5111342 B2 | 1/2013 | |
| JP | 5693977 B2 | 4/2015 | |
| JP | 5700241 B2 | 4/2015 | |
| JP | 5981232 B2 | 8/2016 | |
| JP | 6394136 B2 | 9/2018 | |
| JP | 6542616 B2 | 7/2019 | |
| JP | 6626697 B2 | 12/2019 | |
| KR | 100714196 B1 | 5/2007 | |
| KR | 100731112 B1 | 6/2007 | |
| KR | 10-2008-0037296 A | 4/2008 | |
| KR | 2008052491 A | 6/2008 | |
| KR | 20100097893 A | 9/2010 | |
| KR | 101301507 B1 | 9/2013 | |
| KR | 20140086375 A | 7/2014 | |
| KR | 101494413 B1 | 2/2015 | |
| KR | 20160013706 A | 2/2016 | |
| KR | 20180113885 A | 10/2018 | |
| KR | 101922884 B1 | 11/2018 | |
| KR | 101975302 B1 | 8/2019 | |
| KR | 102012443 B1 | 8/2019 | |
| TW | 201042019 A | 12/2010 | |
| TW | I594397 B | 8/2017 | |
| WO | 2011130300 A1 | 10/2011 | |
| WO | 2013008415 A1 | 1/2013 | |
| WO | 2013126927 A2 | 8/2013 | |
| WO | 2015126438 A1 | 8/2015 | |
| WO | 2017111957 A1 | 6/2017 | |
| WO | 2018013122 A1 | 1/2018 | |
| WO | 2018125184 A1 | 7/2018 | |
| WO | 2019023213 A1 | 1/2019 | |
| WO | 2019066988 A1 | 4/2019 | |
| WO | 2019/177742 A1 | 9/2019 | |

OTHER PUBLICATIONS

Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).

Arfur Rahman. "System-Level Performance Evaluation of Three-Dimensional Integrated Circuits", vol. 8, No. 6, Dec. 2000. pp. 671-678.

Baier, T. et al., Theoretical Approach to Estimate Laser Process Parameters for Drilling in Crystalline Silicon, Prog. Photovolt: Res. Appl. 18 (2010) 603-606, 5 pages.

Chien-Wei Chien et al "Chip Embedded Wafer Level Packaging Technology for Stacked RF-SiP Application",2007 IEEE, pp. 305-310.

Chien-Wei Chien et al. "3D Chip Stack With Wafer Through Hole Technology". 6 pages.

Doany, F.E., et al.—"Laser release process to obtain freestanding multilayer metal-polyimide circuits," IBM Journal of Research and Development, vol. 41, Issue 1/2, Jan.-Mar. 1997, pp. 151-157.

Dyer, P.E., et al.—"Nanosecond photoacoustic studies on ultraviolet laser ablation of organic polymers," Applied Physics Letters, vol. 48, No. 6, Feb. 10, 1986, pp. 445-447.

Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].

Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].

Han, Younggun, et al.—"Evaluation of Residual Stress and Warpage of Device Embedded Substrates with Piezo-Resistive Sensor Silicon Chips" technical paper, Jul. 31, 2015, pp. 81-94.

International Search Report and the Written Opinion for International Application No. PCT/US2019/064280 dated Mar. 20, 2020, 12 pages.

International Search Report and Written Opinion for Application No. PCT/US2020/026832 dated Jul. 23, 2020.

Italian search report and written opinion for Application No. IT 201900006736 dated Mar. 2, 2020.

Italian Search Report and Written Opinion for Application No. IT 201900006740 dated Mar. 4, 2020.

Junghoon Yeom', et al. "Critical Aspect Ratio Dependence in Deep Reactive Ion Etching of Silicon", 2003 IEEE. pp. 1631-1634.

K. Sakuma et al. "3D Stacking Technology with Low-Volume Lead-Free Interconnections", IBM T.J. Watson Research Center. 2007 IEEE, pp. 627-632.

Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.

Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.

Knickerbocker, J.U., et al.—"Development of next-generation system-on-package (SOP) technology based on silicon carriers with fine-pitch chip interconnection," IBM Journal of Research and Development, vol. 49, Issue 4/5, Jul.-Sep. 2005, pp. 725-753.

Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.

L. Wang, et al. "High aspect ratio through-wafer interconnections for 3Dmicrosystems", 2003 IEEE. pp 634-637.

Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.

Liu, C.Y. et al., Time Resolved Shadowgraph Images of Silicon during Laser Ablation: Shockwaves and Particle Generation, Journal of Physics: Conference Series 59 (2007) 338-342, 6 pages.

Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.

NT Nguyen et al. "Through-Wafer Copper Electroplating for Three-Dimensional Interconnects", Journal of Micromechanics and Microengineering. 12 (2002) 395-399. 2002 IOP.

PCT International Search Report and Written Opinion dated Aug. 28, 2020, for International Application No. PCT/US2020/032245.

PCT International Search Report and Written Opinion dated Sep. 15, 2020, for International Application No. PCT/US2020/035778.

Ronald Hon et al. "Multi-Stack Flip Chip 3D Packaging with Copper Plated Through-Silicon Vertical Interconnection", 2005 IEEE pp. 384-389.

S. W. Ricky Lee et al. "3D Stacked Flip Chip Packaging with Through Silicon Vias and Copper Plating or Conductive Adhesive Filling", 2005 IEEE, pp. 798-801.

Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.

(56) References Cited

OTHER PUBLICATIONS

Shi, Tailong, et al.—"First Demonstration of Panel Glass Fan-out (GFO) Packages for High I/O Density and High Frequency Multichip Integration," Proceedings of 2017 IEEE 67th Electronic Components and Technology Conference, May 30-Jun. 2, 2017, pp. 41-46.
Srinivasan, R., et al.—"Ultraviolet Laser Ablation of Organic Polymers," Chemical Reviews, 1989, vol. 89, No. 6, pp. 1303-1316.
Taiwan Office Action dated Oct. 27, 2020 for Application No. 108148588.
Trusheim, D. et al., Investigation of the Influence of Pulse Duration in Laser Processes for Solar Cells, Physics Procedia Dec. 2011, 278-285, 9 pages.
Wu et al., Microelect. Eng., vol. 87 2010, pp. 505-509.
Yu et al. "High Performance, High Density RDL for Advanced Packaging," 2018 IEEE 68th Electronic Components and Technology Conference, pp. 587-593, DOI 10.1109/ETCC.2018.0009.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
PCT International Search Report and Written Opinion dated Feb. 17, 2021 for International Application No. PCT/US2020/057787.
PCT International Search Report and Written Opinion dated Feb. 19, 2021, for International Application No. PCT/US2020/057788.
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.
U.S. Office Action dated May 13, 2021, in U.S. Appl. No. 16/870,843.
Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.
Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 IEEE International, Nov. 16-18, 2010, 6 pages.
PCT International Search Report and Written Opinion dated Feb. 4, 2022, for International Application No. PCT/US2021/053830.
PCT International Search Report and Written Opinion dated Feb. 4, 2022, for International Application No. PCT/US2021/053821.
Taiwan Office Action dated Feb. 25, 2022, for Taiwan Patent Application No. 109119795.

\* cited by examiner

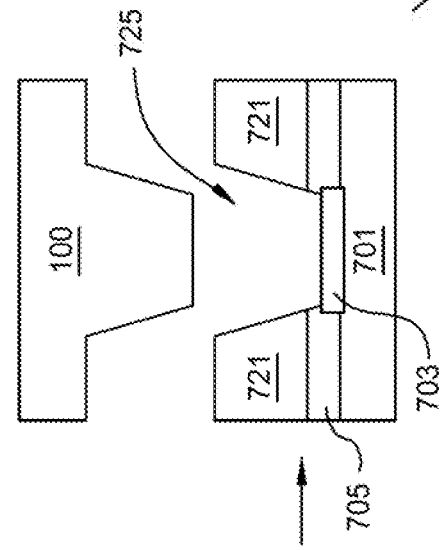
FIG. 7A
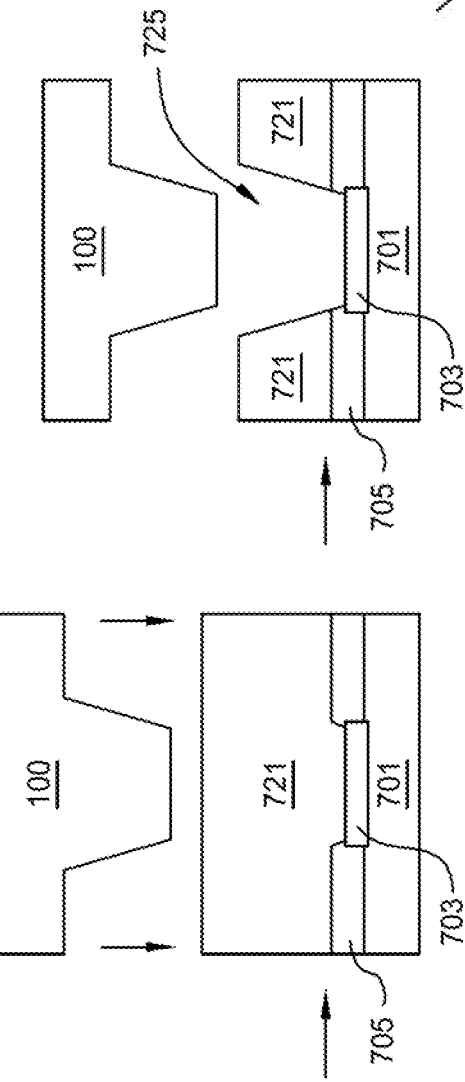
FIG. 7B
FIG. 7C
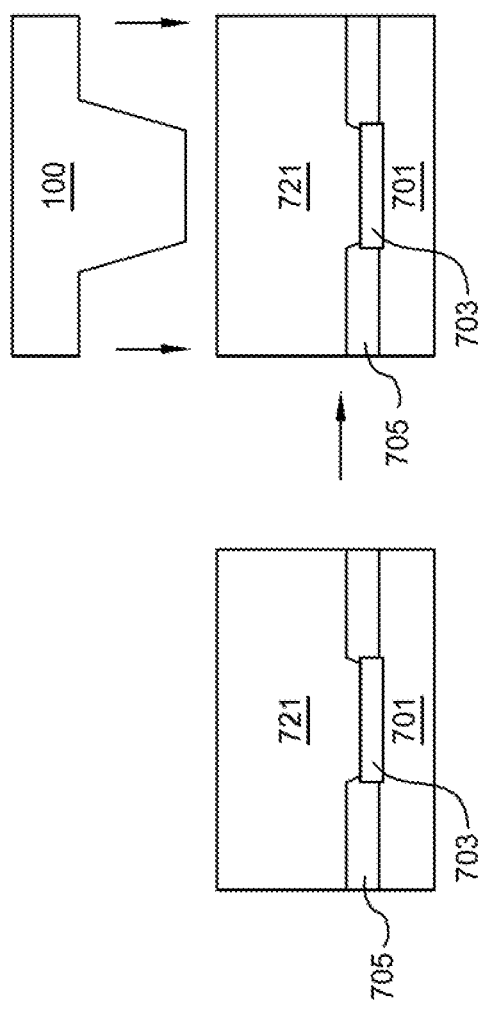
FIG. 7D
FIG. 7E
FIG. 7F

FLUOROPOLYMER STAMP FABRICATION METHOD

BACKGROUND

Field

The present disclosure relates generally to imprint lithography techniques and in particular to a stamp that is used in UV-micro/nanoimprint lithography processes or thermal micro/nanoimprint lithography processes and a method for manufacturing the stamp.

Description of the Related Art

As circuit densities increase and device sizes decrease for next generation semiconductor devices, providing the external connections, such as wiring, to these devices involves advanced packaging technologies. One such packaging technology is wafer level packaging.

Wafer level packaging streamlines the manufacturing and packaging processes of semiconductor devices by integrating device manufacturing, package assembly (packaging), electrical testing, and reliability testing (burn-in) at wafer level, where forming of the top and bottom layers of the packaging, creating the I/O connections, and testing the packaged device are all performed before the devices are singulated into individual packaged components. The advantages of wafer level packaging include reduced overall manufacturing costs of the resulting device, reduced package size, and improved electrical and thermal performance. However, typical wafer level packaging schemes limit the number of I/O connections that can be made to the semiconductor device to the number of I/O terminals that can be spread over the surface of the die. Fan-out wafer level packaging retains the advantages of wafer level packaging while increasing the area available for I/O terminals by redistributing the I/O terminals to areas exterior of the surface of the die, using one or more redistribution layers (RDL).

Fan-out wafer level packaging processes entail that the surface area of the I/O terminal redistribution layer for each individual die be larger than the surface area of the individual die itself. However, maximizing the number of devices (dies) on a wafer minimizes costs during manufacturing of the device, and thus the spaces between individual devices (dice lines) are usually only large enough to accommodate the width of the dicing saw used to dice the wafer into its individual dies. One method of creating the additional surface area external of the die surface is to form a new wafer with dies redistributed in a spaced apart pattern, known as a reconstituted substrate.

Typically, to form a reconstituted substrate, a wafer is singulated into individual die which are then positioned on a molding plate (carrier substrate) spaced apart from one another and temporarily secured thereto by an adhesion layer. A molding compound is dispensed onto the carrier substrate and the dies secured thereto and subsequently cured, which embeds the spaced apart dies in the molding compound to form the reconstituted substrate. The terminal sides of the dies are then exposed by removing the adhesion layer, and redistribution layers, having interconnects disposed therein, are subsequently formed on the reconstituted substrate, to redistribute a portion, or all, of the device's I/O terminals to areas exterior of the surface of the die, which increases the area available for I/O connections and thus the number of possible I/O terminals.

Process defects associated with forming the reconstituted substrate, such as undesirable repositioning of the dies within the reconstituted substrate from their original placement location on the adhesion layer, also known as die shift, cause misalignment between the via interconnects in the subsequently formed redistribution layer and the electrical contacts on the dies. Additionally, the redistribution layers are typically formed using conventional photolithography and etch processes, which are costly, equipment intensive, and time consuming. For example, in some stages of manufacture, a photopatternable dielectric polymer material, such as a polyimide material, is used in the formation of a redistribution layer (RDL) for making wiring connections from chip surface contacts to ball grid array (BGA) pads. In general, photolithographic processes are sensitive to topographic effects, such as differences in patterning layer heights or thickness, due to limitations on the achievable depth of focus (DOF) during exposure processes.

Accordingly, there is a need in the art for improved methods of forming reconstituted substrate and redistribution layers disposed thereon.

SUMMARY

The present disclosure relates generally to imprint lithography techniques and in particular, to a stamp used in UV-micro/nanoimprint lithography processes or thermal micro/nanoimprint lithography processes and a method for manufacturing the stamp.

In one aspect, an imprint lithography stamp includes a backing plate and a stamp body. The backing plate includes a front surface and a backside surface opposite the front surface, wherein the backing plate has a plurality of through-holes extending from the front surface to the backside surface. The stamp body includes a patterned surface having a plurality of protrusions extending from the stamp body and a back surface opposite the patterned surface. The back surface of the stamp body contacts the front surface of the backing plate and a portion of the stamp body extends from the back surface of the stamp body into the plurality of through-holes formed in the backing plate.

Implementations may include one or more of the following. The stamp body may be fabricated from a fluorinated ethylene propylene (FEP) copolymer. The backing plate may be fabricated from glass, ceramic, fiberglass, chrome, stainless steel, or nickel. At least one protrusion of the plurality of protrusions may have a diameter in a range from about 1 micrometer to about 20 micrometers. At least one protrusion of the plurality of protrusions may have a diameter in a range from about 5 micrometers to about 15 micrometers. At least one protrusion of the plurality of protrusions may have a diameter in a range from about 5 micrometers to about 10 micrometers. At least one through-hole of the plurality of through-holes may have a diameter in a range from about 0.5 millimeters to about 1 millimeter. Adjacent protrusions may be separated by a gap which is about twice a diameter of the protrusion or greater. An aspect ratio of at least one protrusion of the plurality of protrusions may be greater than one. The stamp body may have a thickness measured from the patterned surface to the back surface of from about 0.1 millimeters to about 2 millimeters.

In another aspect, a method for forming a redistribution layer includes depositing a polymer layer onto a surface of a reconstituted substrate, the reconstituted substrate comprising a plurality of devices disposed in a molding compound. The method further includes heating the polymer layer to a temperature in a range from about 120 degrees Celsius to about 150 degrees Celsius. The method further includes physically imprinting a pattern into the polymer layer with an imprint lithography stamp to form a plurality of openings therein, wherein the imprint lithography stamp comprises fluorinated ethylene propylene (FEP).

Implementations may include one or more of the following. The imprint lithography stamp may include a backing plate, including a front surface and a backside surface opposite the front surface, wherein the backing plate has a plurality of through-holes extending from the front surface to the backside surface; and a stamp body, including a patterned surface having a plurality of protrusions extending from the stamp body and a back surface opposite the patterned surface, wherein the back surface contacts the front surface of the backing plate and a portion of the stamp body extends from the back surface of the stamp body into the plurality of through-holes formed in the backing plate. The method may further include heating the polymer layer to a temperature in a range from about 180 degrees Celsius to about 200 degrees Celsius after imprinting the pattern. The polymer layer may include a polyimide or an Ajinomoto Build-up Film. Imprinting the pattern into the polymer layer may include heating the imprint lithography stamp to a temperature in a range from about 100 degrees Celsius to about 150 degrees Celsius. Imprinting the pattern into the polymer layer may take place in an environment at less than about atmospheric pressure. Imprinting the pattern into the polymer layer may include exposing the polymer to UV radiation through the imprint lithography stamp. The reconstituted substrate may further include a previously formed redistribution layer disposed on the plurality of devices, the previously formed redistribution layer comprising a dielectric polymer layer having a plurality of metal interconnects disposed therein, wherein the surface of the previously formed redistribution layer has been planarized to remove portions of a seed layer and a metal layer therefrom.

In another aspect, a packaging method includes depositing a polymer layer onto a first surface of a substrate. The method further includes physically imprinting a pattern into the polymer layer with an imprint lithography stamp to form a polymer layer with a plurality of openings therethrough, wherein the imprint lithography stamp is fabricated from fluorinated ethylene propylene (FEP). The method further includes forming a plurality of metal interconnects in the polymer layer including depositing a seed layer onto the substrate and the polymer layer formed thereon and forming a copper layer on the seed layer. The method further includes removing portions of the seed layer and the copper layer from a second surface of the polymer layer.

Implementations may include one or more of the following. The polymer layer may include an Ajinomoto Build-up Film. The method may further include heating the polymer layer to a temperature in a range from about 180 degrees Celsius to about 200 degrees Celsius after imprinting the pattern. Physically imprinting the polymer layer may include heating the imprint lithography stamp to a temperature in a range from about 100 degrees Celsius to about 150 degrees Celsius. Physically imprinting the pattern into the polymer layer may take place in an environment at less than about atmospheric pressure.

In another aspect, a method of manufacturing an imprint lithography stamp includes injecting a fluorinated ethylene propylene polymer melt into an injection mold assembly. The injection mold assembly includes an upper half mold body that defines a first recess; a backing plate inserted in the first recess, the backing plate having a plurality of through-holes; a lower half mold body that defines a second recess; a stamp master plate inserted in the second recess, the stamp master plate having a negative patterned surface that has a plurality of negative features; and a spacer gasket positioned in between the upper half mold body and the lower half mold body, wherein the upper half mold body, the lower half mold body, and the spacer gasket define a cavity in which the imprint lithography stamp is formed. The method further includes filling the cavity and at least a portion of the through-holes of the backing plate with the fluorinated ethylene propylene polymer melt and curing the fluorinated ethylene propylene polymer melt material to form the imprint lithography stamp.

Implementations may include one or more of the following. The imprint lithography stamp may include the backing plate. The stamp master plate may be fabricated from nickel, polydimethylsiloxane (PDMS), or a combination thereof. The backing plate may be fabricated from glass, ceramic, fiberglass, chrome, stainless steel, or nickel. At least one feature of the plurality of negative features may be an aperture having a diameter in a range from about 1 micrometer to about 20 micrometers. The aperture may have a diameter in a range from about 5 micrometers to about 15 micrometers. The aperture may have a diameter in a range from about 5 micrometers to about 10 micrometers. Adjacent features may be separated by a distance in a range from about 1 millimeter to about 2 millimeters. At least one through-hole of the plurality of through-holes may have a diameter in a range from about 0.5 millimeters to about 1 millimeter. The spacer gasket may have a thickness of from about 0.1 millimeters to about 2 millimeters.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIGS. 7A-7F illustrate various stages of a substrate imprint lithography process according to aspects disclosed herein.

Figure 1A:
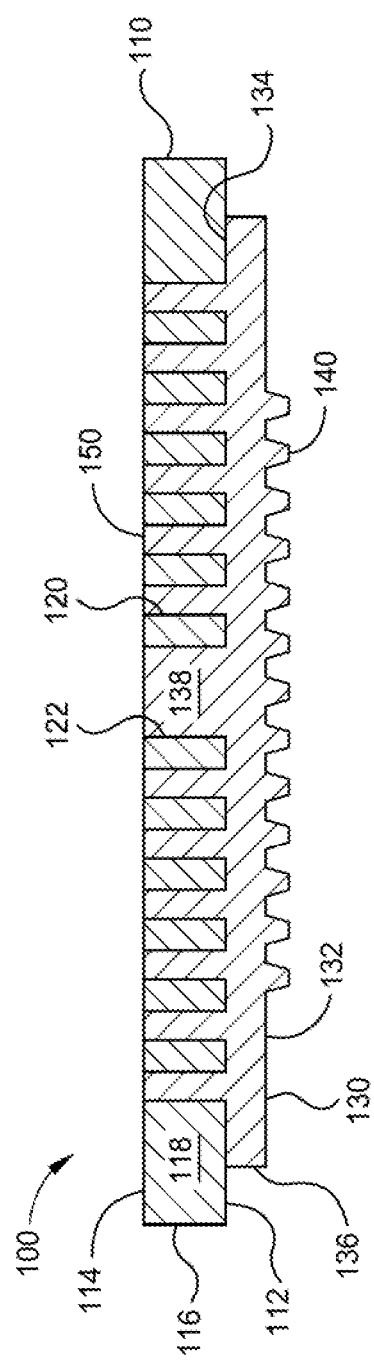
FIG. 1A illustrates a schematic cross-sectional view of an example of an imprint lithography stamp according to aspects disclosed herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

In some wafer-level packaging processes a redistribution layer (RDL) is used to reroute connections to chosen locations. In some stages of manufacture, a patternable dielectric polymer material, such as a polyimide material or Ajinomoto Build-up Film (ABF), is used in the formation of the RDL. Features, such as vias for example, are formed in the patternable dielectric polymer material. In some processes, small vias for example, less than 10 micrometers, are formed in the patternable dielectric polymer material.

Via formation by micro/nanoimprint lithography in dielectric polymer materials such as ABF and polyimide has been proposed. Current materials used for forming the imprint lithography stamps used in the micro/nanoimprint lithography processes include polydimethylsiloxane (PDMS). However, there are problems with imprint lithography stamps formed from PDMS material when high temperatures, such as temperatures greater than 50 degrees Celsius are used during the lithography process. For example, in an imprint lithography process that uses ABF, temperatures of 120 to 150 degrees Celsius or more can be used. At these high temperatures, PDMS loses its rigidity, which can lead to feature deformation in the patternable dielectric polymer material such as bending of the features formed in the patternable dielectric polymer material. Other materials such as fused silica do not have anti-stiction properties and thus cannot demold from ABF.

As noted above, imprinting with lithography stamps composed of materials such as PDMS has been proposed. As described herein, by manufacturing the imprint lithography stamp with a more durable material, high aspect ratio vias, for example, vias having an aspect ratio greater than one can be formed in photopatternable dielectric polymer materials that involve higher processing temperatures without the feature deformation caused by imprinting with PDMS lithography stamps.

In one aspect of the present disclosure, a microimprint lithography stamp is formed from fluorinated ethylene propylene (FEP) copolymer material. FEP is a copolymer of hexafluoropropylene and tetrafluoroethylene. FEP material typically has 200 times higher Young's Modulus and twice as much hardness as PDMS, yet has superior anti-stick properties. Similar to PDMS, FEP is transparent and also has a thermal expansion coefficient (CTE) that is lower than PDMS. However, FEP is more difficult to mold than PDMS. Thus, in additional aspects of the present disclosure, an injection mold assembly and an injecting molding method for forming an FEP imprint lithography stamp are provided. In one aspect, the injection mold assembly includes a PDMS stamp insert that is positioned in the injection mold assembly and used to transfer a pattern to the FEP imprint lithography stamp. In one example, the pattern transfer is obtained using a PDMS stamp insert, which is positioned in the injection mold.

FIG. 1A illustrates a schematic cross-sectional view of an example of an imprint lithography stamp 100. In one example, the imprint lithography stamp 100 is a microimprint lithography stamp. In another example, the imprint lithography stamp is a nanoimprint lithography stamp. The imprint lithography stamp 100 includes a backing plate 110 and a stamp plate 130 coupled with the backing plate 110.

The backing plate 110 includes a front surface 112, a backside surface 114 opposite the front surface 112, and an outer peripheral wall 116 which define a body 118.

The backing plate 110 includes a plurality of through-holes 120. The plurality of through-holes 120 extend from the front surface 112 through the body 118 to the backside surface 114. In one example, at least one through-hole of the plurality of the plurality of through-holes has a diameter in a range from about 0.1 millimeter to about 1 millimeter, for example, in a range from about 0.5 millimeters to about 1 millimeter. The plurality of through-holes 120 are dimensioned to accommodate at least a portion of the stamp plate 130.

The backing plate 110 further includes an injection port 122, which extends from the front surface 112 through the body 118 to the backside surface 114. The injection port 122 provides a port for delivery of polymer melt material into an injection mold assembly, which is used to form the stamp plate 130. The injection port 122 will be discussed in further detail with reference to FIG. 2.

The body 118 of the backing plate 110 can be formed of glass, ceramic, fiberglass, chrome, stainless steel, or nickel. In one example, the backing plate 110 is formed from glass. Forming the backing plate 110 from a transparent or a semi-transparent material permits easier alignment of the imprint lithography stamp 100. The body 118 of the backing plate 110 can have a thickness in a range from about 0.2 mm to about 1.0 mm, for example from about 0.3 mm to about 0.75 mm. The body 118 of the backing plate 110 can be from about 20 mm across to about 30 mm across, for example, about 25 mm across. The body 118 of the backing plate 110 can be square (from a top view of the backing plate 110), rectangular, circular or any other shape. In one implementation, the body 118 of the backing plate 110 has a surface area from about 500 mm$^2$ to about 700 mm$^2$, for example, from about 600 mm$^2$ to about 650 mm$^2$, such as about 625 mm$^2$. In one example, where the body 118 of the backing plate 110 is square, the body 118 of the backing plate 110 has dimensions of 25 mm by 25 mm.

The backing plate 110 provides rigidity to the imprint lithography stamp 100. For example, if the imprint lithography stamp 100 were made without the backing plate 110, the stamp plate 130 can expand upon heating, which shifts the position of the protrusions 140 adversely affecting the pattern formed in the dielectric polymer material. In addition, the backing plate 110 also serves as an insert in the injection mold assembly 200, which is used to form the imprint lithography stamp 100.

The stamp plate 130 includes a patterned surface 132, a back surface 134 opposite the patterned surface 132, and an outer peripheral wall 136 which define a body 138. The body 138 of the stamp plate 130 can be formed of a polymer that does not deform above 50 degrees Celsius. In one example, the body 138 of the stamp plate 130 is formed of fluorinated ethylene propylene (FEP) copolymer. The stamp plate 130 can be formed using the injection molding process described herein. The body 138 of the stamp plate 130 can have a thickness in a range from about 0.1 mm to about 2.0 mm, for example from about 0.1 mm to about 1 mm such as from about 0.3 mm to about 0.75 mm. The body 138 of the stamp plate 130 can be from about 20 mm across to about 30 mm across, for example, about 25 mm across. The body 138 of the stamp plate 130 can be square (from a top view of the backing plate 110), rectangular, circular or any other shape. In one implementation, the patterned surface 132 of the stamp plate 130 has a surface area from about 500 mm$^2$ to about 700 mm$^2$, for example, from about 600 mm$^2$ to about 650 mm$^2$, such as about 625 mm$^2$. In one example, where the body 138 of the stamp plate 130 is square, the patterned surface 132 has dimensions of 25 mm by 25 mm.

Figure 1B:
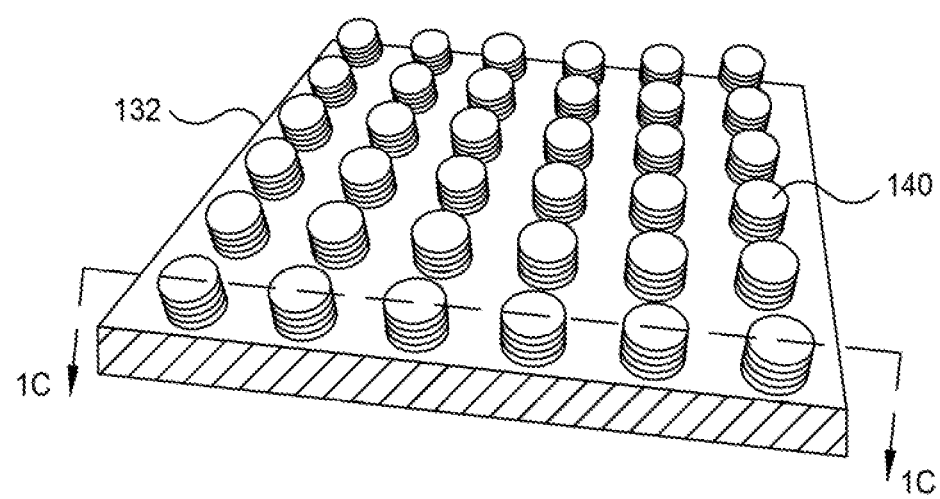
FIG. 1B illustrates a partial perspective view of an example of a patterned surface of an imprint lithography stamp according to aspects disclosed herein.
Figure 1C:
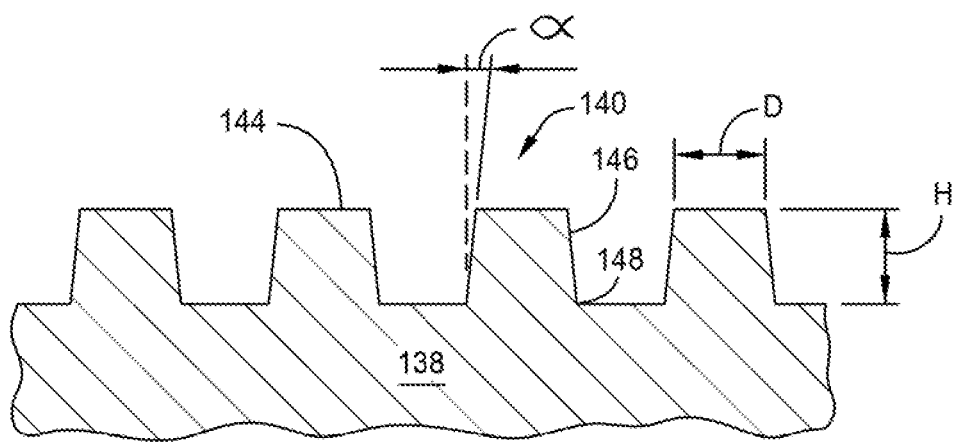
FIG. 1C illustrates an enlarged cross-sectional view of a portion of the imprint lithography stamp taken along line 1C-1C of FIG. 1A.

FIG. 1B illustrates a partial perspective view of an example of the patterned surface 132 of the imprint lithography stamp 100 according to aspects disclosed herein. The patterned surface 132 includes a plurality of protrusions 140 extending from the patterned surface 132. The protrusions 140 are arranged in an x-y grid pattern across the patterned surface 132. FIG. 1C illustrates an enlarged cross-sectional view of a portion of the imprint lithography stamp 100 take along line 1C-1C of FIG. 1A. In the example of FIGS. 1A-1C, the protrusions 140 have a pillar shape with a tapered profile. However, other suitable shapes for the protrusions 140 are also contemplated.

The plurality of protrusions 140 extend from the patterned surface 132 of the stamp body 138. Referring to FIG. 7B, the protrusions 140 form the corresponding features in the dielectric polymer material. Referring to FIG. 1C, in one example, a height "H" of the protrusions 140 can be from about 5 microns to about 20 microns, for example, from about 10 micrometers to about 15 micrometers and a width or diameter "D" measured at the base of the protrusions 140 can be from about 1 micrometer to about 20 micrometers, for example, from about 5 micrometers to about 15 micrometers, such as from about 5 micrometers to about 10 micrometers. The plurality of protrusions 140 are unitary with the stamp body 138. The plurality of protrusions 140 can be formed with the stamp body 138 using the injection molding process described herein.

In one example, the patterned surface 132 has a surface area from about 500 mm$^2$ to about 700 mm$^2$ and has from about 100 to about 500 protrusions 140, for example, from about 150 to about 200 protrusions 140 that occupy from about 3% to about 9% of the surface area of the patterned surface 132. In another example, the patterned surface 132 has a surface area of from about 625 mm$^2$ to about 650 mm$^2$ and has from about 100 to about 200 protrusions 140 that occupy from about 3% to about 9% of the area of the patterned surface 132.

In one example, the protrusions 140 are arranged in a substantially linear arrangement across the patterned surface 132. In another example, the protrusions 140 are arranged in a radial pattern emanating from a center of the patterned surface 132. In another example, as shown in FIG. 1B, the protrusions 140 are arranged in an x-y grid pattern across the patterned surface 132. In yet another example, the protrusions 140 are arranged in an array of staggered rows. In one example, the protrusions 140 are uniformly spaced with a pitch "P." In one example, the pitch "P" is 2 times the diameter "D" of the protrusions 140. In another example, the pitch "P" is 3 times the diameter "D" of the protrusions 140.

In yet another example, the pitch "P" is 4 times the diameter "D" of the protrusions 140. In yet another example, the pitch "P" is 5 times the diameter "D" of the protrusions 140.

The protrusions 140 are shaped to form a corresponding via of chosen shape in the dielectric polymer material to be patterned. In one example, as depicted in FIGS. 1A-1C, the pillar shape of the protrusions 140 is cylindrical with a planarized top surface 144 and tapered sidewall(s) 146. As depicted in FIG. 1C, the sidewall(s) 146 of the protrusion 140 can be tapered from a base 148 to the planarized top surface 144. In one example, the sidewall(s) are tapered, for example, at an angle "α" from about 2 degrees to about 8 degrees from vertical, for example, from about 4 degrees to about 6 degrees from vertical, such as about 5 degrees from vertical. Tapering the sidewall(s) makes it easier to demold the imprint lithography stamp 100 from the material that is patterned. In another example, the shape of the protrusions 140 has a square foundation with a planarized surface. Other suitable shapes for the plurality of protrusions 140 can include cylindrical mounds, posts, pyramids, cones, rectangular blocks, protrusions of varying sizes, or a combination thereof.

The stamp plate 130 further includes the back surface 134 opposite the patterned surface 132. As depicted in FIG. 1A, the back surface 134 of the stamp plate 130 contacts the front surface 112 of the backing plate 110. Portion(s) 150 of the stamp body 138 extend from the back surface 134 of the stamp body 138 into the plurality of through-holes 120 formed in the backing plate 110, which helps bond the stamp plate 130 to the backing plate 110. Since FEP is generally hydrophobic and has poor sticking properties, the portion(s) 150 help the stamp plate 130 adhere to the backing plate 110. In one example, the portion(s) 150 of the stamp plate 130 that extends into at least one through-hole 120 substantially fills the through-hole 120. In another example, the portion(s) 150 of the stamp plate 130 that extends into the at least one through-hole 120 fills only a portion of the through-hole 120. Any suitable amount of the portion(s) 150 of the stamp plate 130 can extend into the through-hole 120 as long as the portion is sufficient to secure the stamp plate 130 to the backing plate 110.

Figure 2:
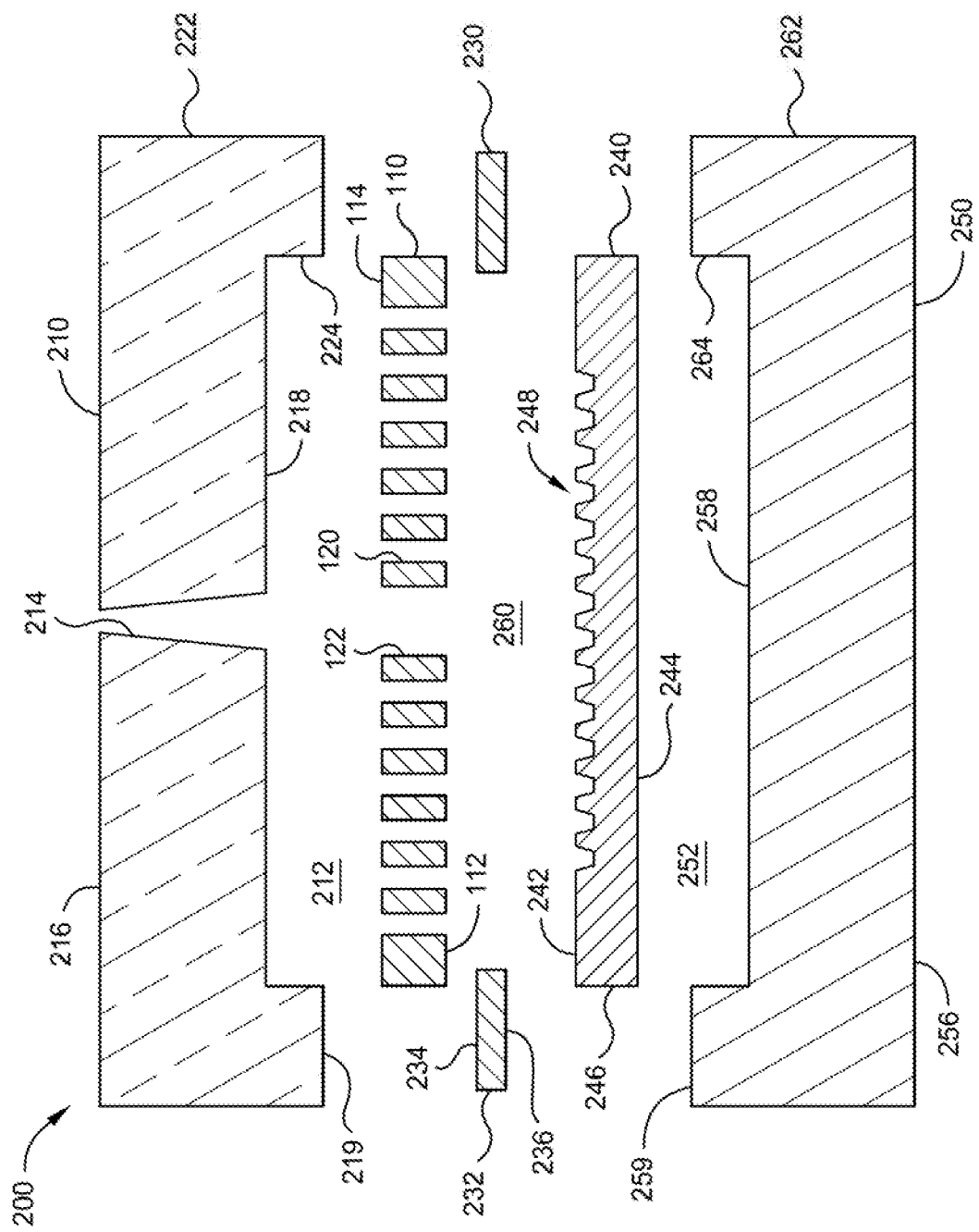
FIG. 2 Illustrates an exploded schematic cross-sectional view of an example of an injection mold assembly for forming an imprint lithography stamp according to aspects disclosed herein.

FIG. 2 Illustrates an exploded schematic cross-sectional view of an example of an injection mold assembly 200 used in an injection molding process for forming an imprint lithography stamp according to aspects disclosed herein. The imprint lithography stamp formed by the injection mold assembly 200 can be the imprint lithography stamp 100 depicted in FIG. 1. The injection mold assembly 200 includes an upper half mold body 210, the backing plate 110, a spacer gasket 230, a stamp master plate 240, and a lower half mold body 250.

Figure 3:
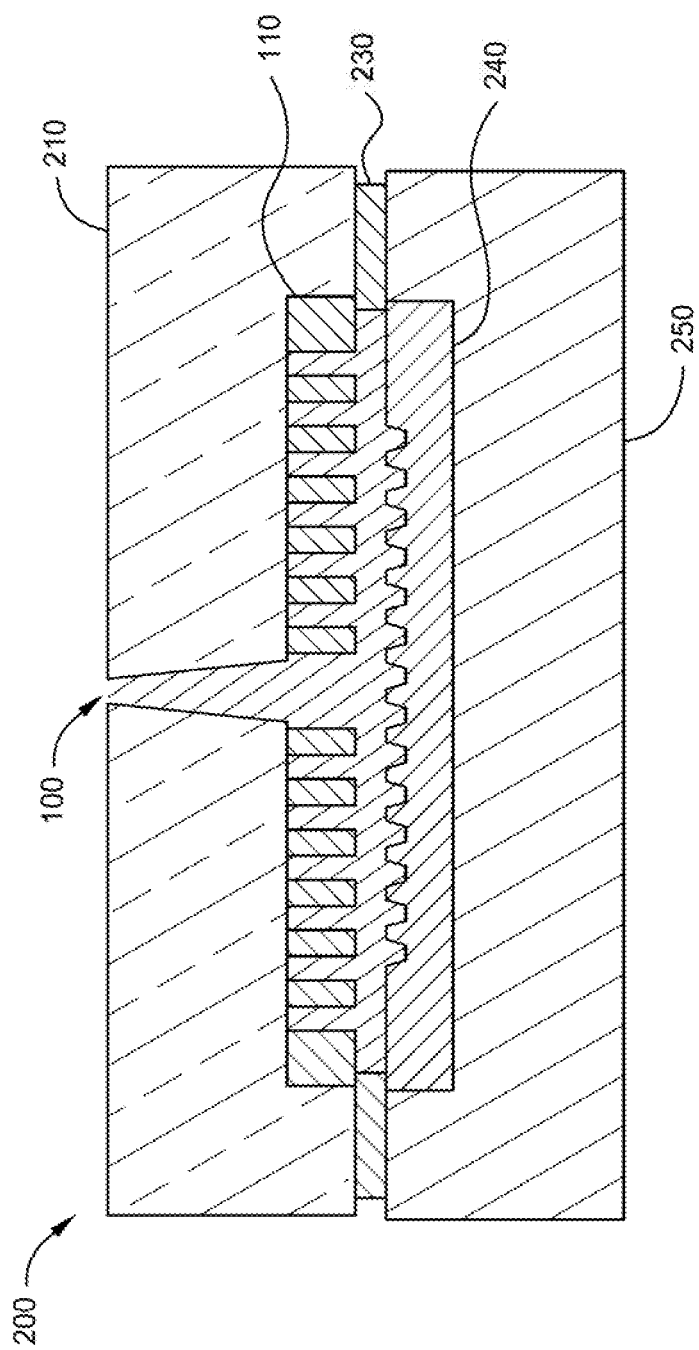
FIG. 3 illustrates a schematic cross-sectional view of the imprint lithography stamp of FIG. 1 formed in the injection mold assembly of FIG. 2 according to aspects disclosed herein.

The upper half mold body 210 is defined by a first surface 216, a second surface 218 opposite the first surface 216, a third surface 219 opposite the first surface 216, at least one outer sidewall 222, and at least one inner peripheral wall 224. The upper half mold body 210 defines a first recess 212. The first recess 212 is defined by the second surface 218 and the inner peripheral wall 224, which extends from the second surface 218 to the third surface 219. As depicted in FIG. 3, the first recess 212 of the upper half mold body 210 is sized to accommodate the backing plate 110.

The upper half mold body 210 further includes an injection port 214, which extends from the first surface 216 of the upper half mold body 210 to the second surface 218 of the upper half mold body 210, which also serves as the bottom surface of the first recess 212. The injection port 214 of the upper half mold body 210 aligns with the injection port 122 of the backing plate 110. The injection port 214 is typically coupled with an injection molding machine. Polymer material is melted in the injection molding machine and then injected into the injection mold assembly 200 via the injection port 214, where the polymer material melt cools and solidifies to form the imprint lithography stamp 100.

The upper half mold body 210 can be composed of any material that can withstand process temperatures while demolding from the formed imprint lithography stamp 100. In one example, the upper half mold body 210 is composed of stainless steel.

The injection mold assembly 200 further includes the lower half mold body 250. The lower half mold body 250 is defined by a first surface 256, a second surface 258 opposite the first surface 256, a third surface 259 opposite the first surface 256, at least one outer sidewall 262, and at least one inner peripheral wall 264. The lower half mold body 250 defines a second recess 252. The second recess 252 is defined by the second surface 258 and the inner peripheral wall 264, which extends from the second surface 258 to the third surface 259. As depicted in FIG. 3, the second recess 252 of the lower half mold body 250 is sized to accommodate the stamp master plate 240.

The lower half mold body 250 can be composed of any material that can withstand process temperatures while demolding from the formed imprint lithography stamp 100. In one example, the lower half mold body 250 is composed of stainless steel.

The injection mold assembly 200 further includes the spacer gasket 230. The spacer gasket 230 The spacer gasket 230 includes an annular band 232. As depicted in FIG. 3, the spacer gasket 230 is positioned in between the upper half mold body 210 and the lower half mold body 250. When pressed together, the spacer gasket 230, the upper half mold body 210, and the lower half mold body 250 define a cavity 260 in which the imprint lithography stamp 100 is formed. The spacer gasket 230 defines a thickness of the stamp plate 130 extending from the patterned surface 132 to the back surface 134. The thickness of the stamp plate 130 can be either increased or decreased by either increasing or decreasing the thickness of the spacer gasket 230. In one example, the spacer gasket 230 has a thickness measured from a top surface 234 of the spacer gasket 230 to a bottom surface 236 of the spacer gasket 230 in a range from about 0.1 mm to about 2.0 mm, for example from about 0.1 mm to about 1 mm such as from about 0.3 mm to about 0.75 mm. The spacer gasket 230 is also positioned between the front surface 112 of the backing plate 110 and a negative patterned surface 242 of the stamp master plate 240. Thus, the spacer gasket 230 supports the backing plate 110 when the injection mold assembly 200 is empty preventing the backing plate 110 from contacting the stamp master plate 240. The spacer gasket 230 can be composed of any material that can withstand process temperatures while demolding from the formed imprint lithography stamp 100. In one example, the spacer gasket 230 is composed of stainless steel. In another example, the spacer gasket 230 is composed of brass.

The injection mold assembly 200 further includes the stamp master plate 240. As depicted in FIG. 3, the stamp master plate 240 is inserted in the second recess 252 of the lower half mold body 250. The stamp master plate 240 includes a negative patterned surface 242, a bottom surface 244 opposite the negative patterned surface 242, and an outer peripheral wall 246. The negative patterned surface 242 defines a negative mold, which includes a plurality of negative features 248 that form the protrusions 140 on the patterned surface 132 of the stamp body 138. The negative patterned surface 242 is representative of the patterned surface 132 of the stamp body 138 in that the negative features 248 of the negative patterned surface 242 appear as protrusions 140 on the stamp body 118. Thus, the negative features 248 of the negative patterned surface 242 are used to make the positive protrusions 140 of the patterned surface 132.

In one example, at least one feature of the plurality of negative features 248 is an aperture having a diameter in a range from about 1 micrometer to about 20 micrometers. In another example, at least one feature of the plurality of negative features 248 is an aperture having a diameter in a range from about 5 micrometers to about 15 micrometers. In yet another example, at least one feature of the plurality of negative features 248 is an aperture having a diameter in a range from about 5 micrometers to about 10 micrometers. In one example, adjacent features of the plurality of negative features 248 are separated by a distance in a range from about 1 millimeter to about 2 millimeters.

The injection mold assembly 200 can further include internal cooling or heating lines where a fluid is cycled through the injection mold assembly 200.

The stamp master plate 240 is molded from a master. In one example, the stamp master plate 240 is made from a semi-transparent material such as PDMS or nickel. Materials such as nickel or PDMS easily demold from the formed patterned surface 132 of the stamp plate 130.

Figure 4A:
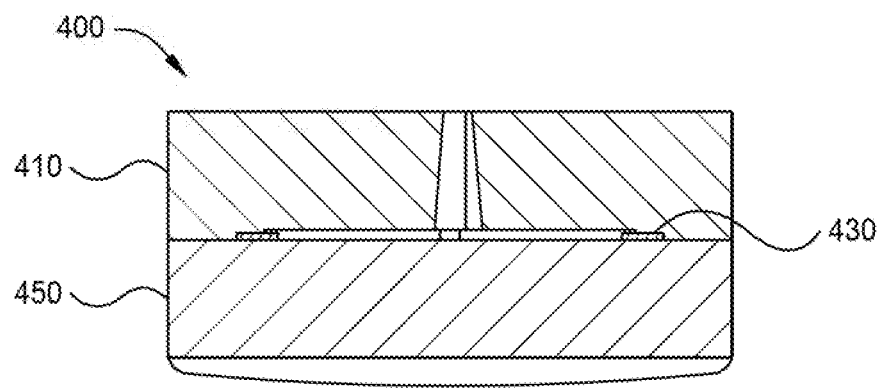
FIG. 4A illustrates a perspective view of an example of an injection mold assembly for forming an imprint lithography stamp according to aspects disclosed herein.
Figure 4B:
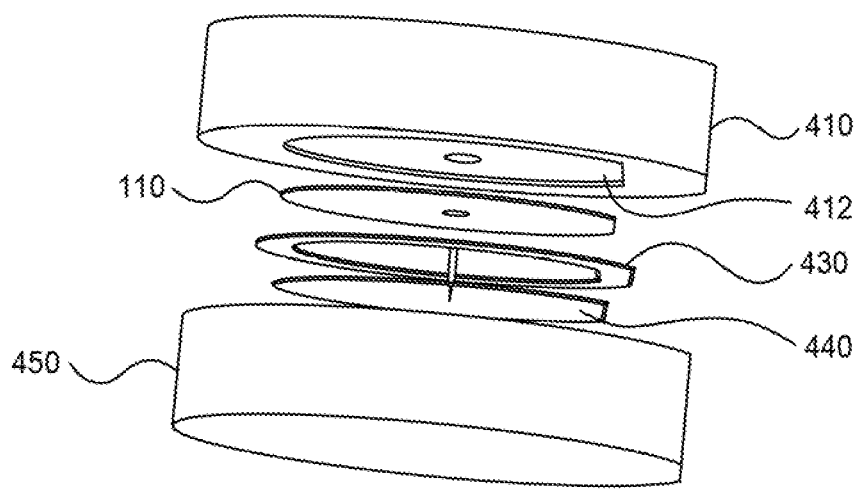
FIG. 4B illustrates an exploded perspective view of the injection mold assembly depicted in FIG. 4A.
Figure 4C:
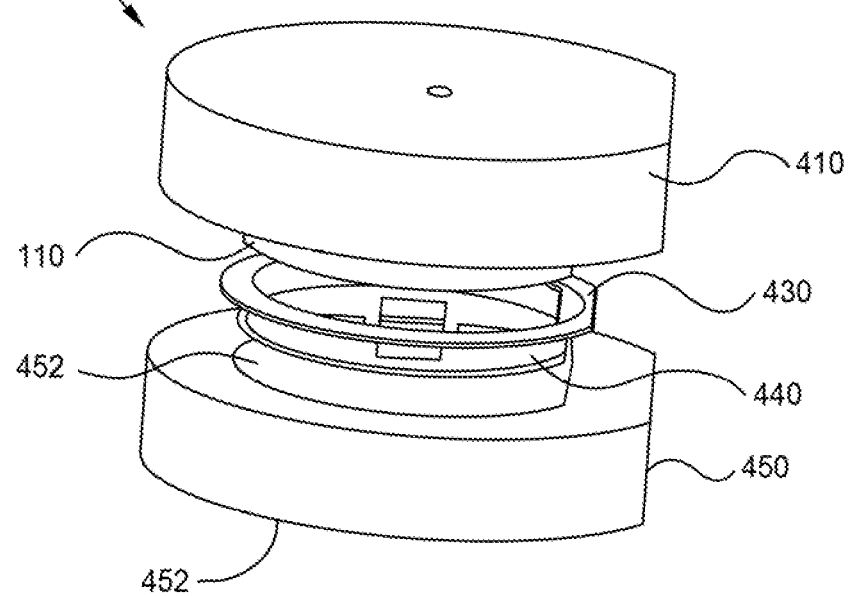
FIG. 4C illustrates another exploded perspective view of the injection mold assembly depicted in FIG. 4A.

FIG. 4A illustrates a perspective view of another example of an injection mold assembly 400 for forming an imprint lithography stamp according to aspects disclosed herein. FIG. 4B illustrates an exploded perspective view of the injection mold assembly 400 depicted in FIG. 4A. FIG. 4C illustrates another exploded perspective view of the injection mold assembly 400 depicted in FIG. 4A. Similar to the injection mold assembly 200, the injection mold assembly 400 includes an upper half mold body 410, the backing plate 110, a spacer gasket 430, a stamp master plate 440, and a lower half mold body 450. The upper half mold body 410 is similar to the upper half mold body 210 of the injection mold assembly 200. The spacer gasket 430 is similar to the spacer gasket 230 of the injection mold assembly 200. The stamp master plate 440 can be similar to the stamp master plate 240. As depicted in FIG. 4A, the spacer gasket 430 is sandwiched in between the upper half mold body 410 and the lower half mold body 450. Referring to FIG. 4B, the upper half mold body 410 defines a first recess 412 sized to accommodate the backing plate 110. Referring to FIG. 4C, the lower half mold body 450 defines a second recess 452 sized to accommodate the stamp master plate 440.

Figure 5:
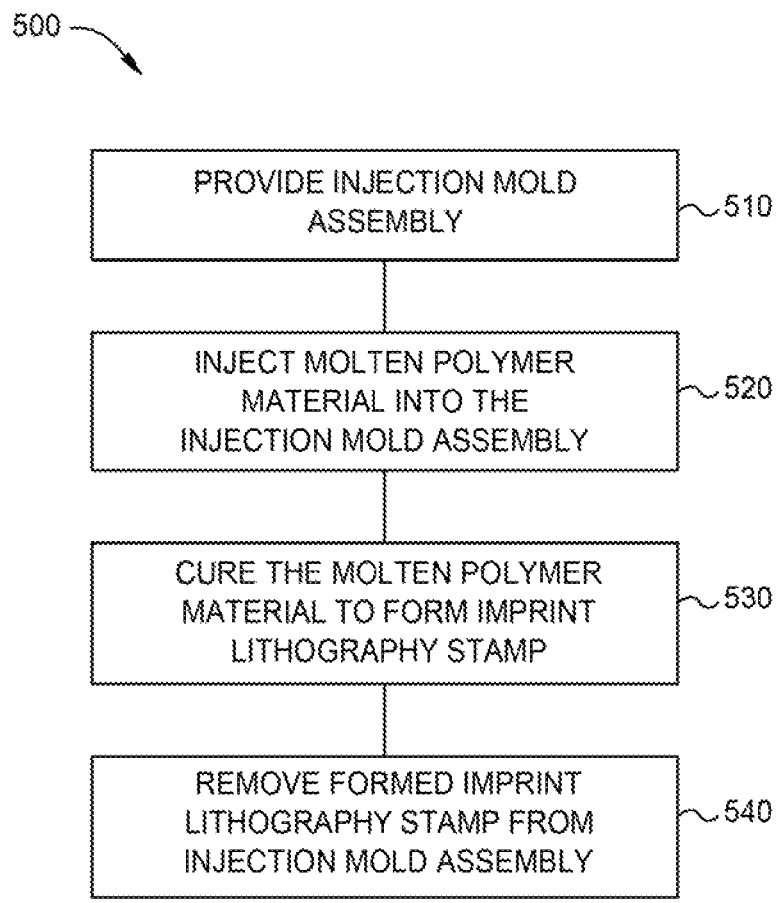
FIG. 5 illustrates a flowchart of a method of manufacturing an imprint lithography stamp according to aspects disclosed herein.

FIG. 5 illustrates a flowchart of a method 500 of manufacturing an imprint lithography stamp according to aspects disclosed herein. The method 500 can be used to form the imprint lithography stamp 100. At operation 510 an injection mold assembly is provided. The injection mold assembly can be the injection mold assembly 200 or the injection mold assembly 400. The injection mold assembly is typically coupled with an injection molding unit. The method 500 begins as the mold closes.

At operation 520, molten polymer material, for example, heated FEP copolymer is injected into the injection mold assembly. In one example, prior to injecting the molten polymer material into the injection mold assembly, the two halves of the injection mold assembly are securely closed together with the spacer gasket sandwiched in between. The polymer material is delivered to the injection molding unit, usually in the form of pellets, and advanced toward the injection mold assembly by the injection molding unit. The polymer material is melted in the injection molding unit by temperature and/or pressure and then the molten polymer material is injected into the injection mold assembly. As the molten polymer material enters the injection mold assembly, the displaced air escapes through vents in the injection mold assembly design, for example, air can escape through vents in the injection pins and along the parting line.

Referring to FIG. 2, the molten polymer material is delivered to the injection mold assembly 200 via injection port 214. In one example, the polymer melt material travels through the injection port 122 of backing plate 110 and fills the cavity 260 defined by the negative patterned surface 242 of the stamp master plate 240, the front surface 112 of the backing plate 110, and the spacer gasket 230. The polymer melt material flows from the cavity 260 into the through-holes 120 to form portion(s) 150.

At operation 530, the polymer material is cured to form the imprint lithography stamp. The polymer melt material that is inside the injection mold assembly begins to cool as it contacts the interior surfaces of the injection mold assembly. Once the injection mold assembly is filled, the polymer melt material is allowed to cool for the amount of time needed to harden the polymer material to form the imprint lithography stamp. Cooling time typically depends on the type of polymer melt used and the thickness of the imprint lithography stamp.

After sufficient time has passed, at operation 540, the imprint lithography stamp is removed from the injection mold assembly. After operation 540, some post processing can occur. For example, during cooling polymer material in the injection port can solidify and attach to the imprint lithography stamp. This excess material along with any flash that has occurred can be trimmed from the part, using, for example, cutters. In some examples, the scrap material resulting from the trimming is can be recycled and reused in the method 500.

Figure 6:
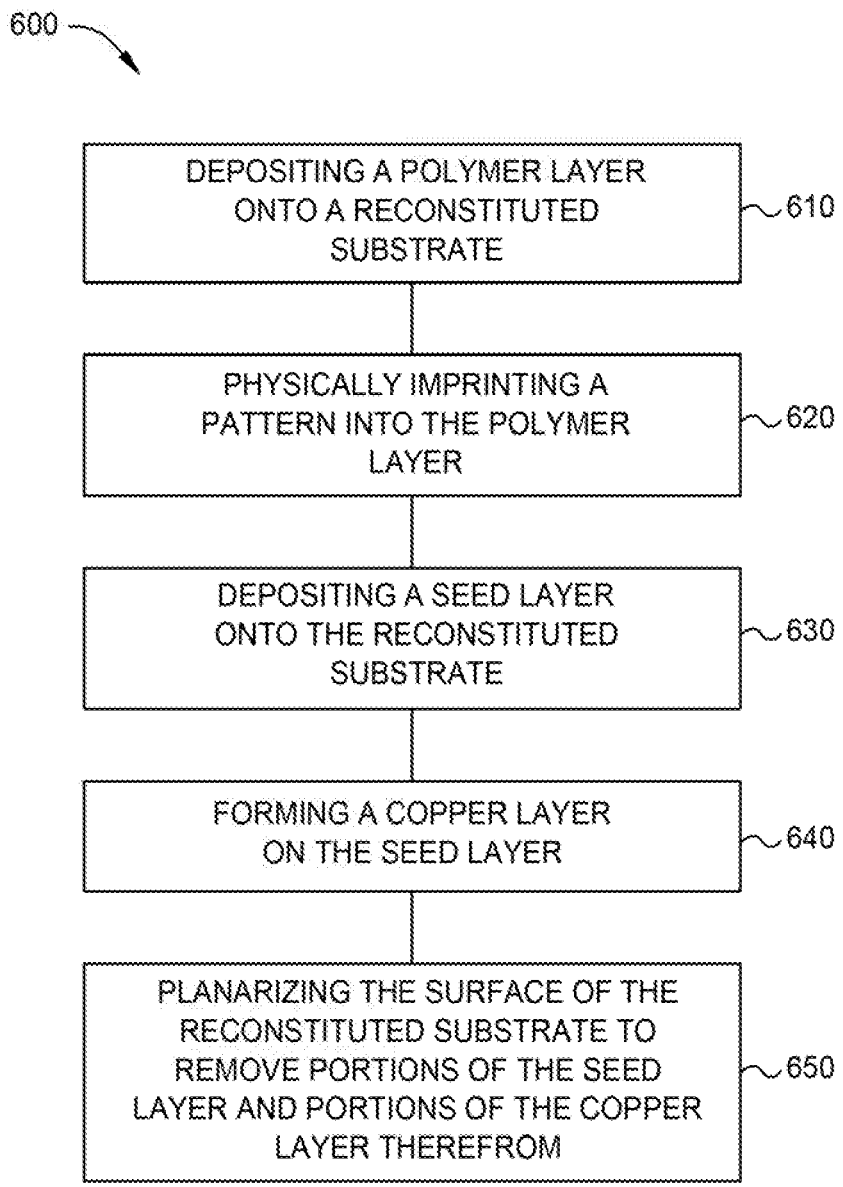
FIG. 6 illustrates a flowchart of a method of using an imprint lithography stamp according to aspects disclosed herein.

FIG. 6 illustrates a flowchart of a method 600 of using an imprint lithography stamp according to aspects disclosed herein. FIGS. 7A-7F illustrate various stages of a substrate imprint lithography process according to aspects disclosed herein. Although method 600 and FIGS. 7A-7F are discussed in the context for forming a redistribution layer, it should be understood that the imprint lithography stamp can be used to physically imprint other types of polymer layers.

The method 600 begins at operation 610 with depositing a polymer layer 721, such as a dielectric polymer layer, such as a polyimide layer or ABF layer, onto a surface of a reconstituted substrate (not shown). In one example, the ABF layer is a three-layer polymer system including a polyethylene terephthalate (PET) support film, a resin layer, and a cover film. Herein, the polymer layer 721 is deposited using a spin coating and soft bake method where a dielectric polymer precursor, for example, a polyimide precursor or an ABF precursor, is dispensed onto a rotating reconstituted substrate until a uniform layer of the dielectric polymer precursor is formed thereon. The reconstituted substrate and the dielectric polymer precursor disposed thereon are heated to a temperature in a range from about 120 degrees Celsius to about 150 degrees Celsius (soft baked) to remove only a portion of the solvents contained in the dielectric polymer precursor making the polymer layer 721 suitable for subsequent imprinting.

FIG. 7A shows a portion of a device 704 embedded in a reconstituted substrate (not shown) having the polymer layer 721 disposed thereon. The device 704 includes an active portion 701 having a metal layer and a passivation layer 705 disposed thereon and an opening formed in the passivation layer 705 to expose a contact pad(s) 703 of the metal layer therebeneath.

The method 600 continues at operation 620 with physically imprinting a pattern into the polymer layer 721 using an imprint lithography stamp, such as the imprint lithography stamp 100 shown in FIG. 1. In one example, operation 620 includes a thermal imprint process where at least one of the imprint lithography stamp 100 and the polymer layer 721 is heated. The polymer layer 721 can be a non-photosensitive dielectric polymer. In another example, operation 620 includes a UV imprint lithography process where the polymer layer 721 comprises a photosensitive dielectric material.

Herein, the imprint lithography stamp 100 includes a via pattern used in forming a fanned out redistribution layer over one or more individual die of the reconstituted substrate in a step and repeat in another area process. In other examples, the imprint lithography stamp 100 includes a plurality of patterns used in forming a plurality of fanned out redistribution interconnects over a plurality of dies in a single imprint. In some implementations, a single imprint lithography stamp is used to form a plurality of openings in the polymer layer 721 over the entire reconstituted substrate in a single imprint. In one example, the imprint lithography stamp 100 is heated to a temperature in a range from about 100 degrees Celsius to about 150 degrees Celsius and is pressed into the polymer layer 721, which is displaced around the pattern of the imprint lithography stamp 100. In another example, the polymer layer 721 is heated to a temperature in a range from about 120 degrees Celsius to about 150 degrees Celsius, for example from about 130 degrees Celsius to about 140 degrees Celsius, and the imprint lithography stamp 100 is pressed into the heated polymer layer 721. In yet another example, both the polymer layer 721 and the imprint lithography stamp 100 are heated.

The imprint lithography stamp 100 is subsequently cooled and removed from the polymer layer 721 leaving a via opening formed therein, such as opening(s) 725 shown in FIG. 7C. The imprint lithography stamp 100 is moved over another die on the reconstituted substrate and the process is repeated until the opening(s) 725 is formed in the polymer layer 721 over all chosen dies on the reconstituted substrate. In implementations using a UV imprint lithography process, the imprint lithography stamp 100 includes a UV transparent material, such as FEP, and a polymer layer 721 comprising a photosensitive dielectric polymer is exposed to UV radiation through the imprint lithography stamp 100. In one example, the UV radiation includes about 365 nm at 200 mJ/cm$^2$. In some implementations, operation 620 takes place in a low pressure atmosphere, such as in a processing system having a processing volume maintained at a pressure less than atmospheric pressure, such as less than one half of atmospheric pressure, or less than about 400 Torr, for example less than about 300 Torr. Physically imprinting a pattern into the polymer layer 721 using imprint lithography stamp 100 in a low pressure atmosphere desirably removes, reduces, and/or substantially eliminates voids (not shown) formed in the polymer layer 721 during and/or subsequent to the formation thereof.

After formation of the opening(s) 725, the reconstituted substrate can be thermally cured in a nitrogen environment. In one example, the reconstituted substrate is thermally cured at a temperature from about 180 degrees Celsius to about 200 degrees Celsius. Residual polymer on the contact pad(s) 703 can be subsequently removed using an oxygen plasma descum or other suitable method. In some implementations, such as implementations using a UV imprint lithography process the oxygen plasma descum is before the thermal cure.

The method 600 continues at operation 630 with depositing a seed layer 709 over the polymer layer 721 and the opening(s) 725 disposed therein. The seed layer 709 enables subsequent electroplating of a metal layer, herein copper, and provides a barrier to prevent diffusion of copper atoms, from the subsequently formed metal layer, into the surrounding polymer layer 721 and the contact pad(s) 703. Herein, the seed layer 709 includes tantalum, tantalum nitride, tungsten, titanium, titanium tungsten, titanium nitride, tungsten nitride, titanium copper, or a combination thereof. The seed layer 709 is deposited using any suitable method such as chemical vapor deposition (CVD), physical vapor deposition (PVD), atomic layer deposition (ALD), or a combination thereof.

The method 600 continues at operation 640 with forming a metal layer, such as the metal layer 717 shown in FIG. 7E, on the seed layer 709 using an electroplating process. Herein, the metal layer 717 includes copper. In other implementations, the metal layer 717 and subsequently formed metal interconnect comprises copper, nickel, gold, antimony silver, or a combination thereof.

At operation 650, the method 600 includes planarizing the surface of the reconstituted substrate to remove portions of the metal layer 717 and the seed layer 709 disposed on the surface of the polymer layer 721 to form one or more interconnect structures 727 in a redistribution layer 714 as shown in FIG. 7F. Planarization of the surface of the reconstituted substrate is done using a chemical mechanical polishing (CMP) and/or a grinding process.

Implementations of the present disclosure can include one or more of the following potential advantages. By manufacturing the imprint lithography stamp with a more durable material, such as FEP, high aspect ratio vias, for example, vias having an aspect ratio greater than one can be formed in photopatternable dielectric polymer materials that involve higher processing temperatures, such as ABF and polyimides, without the feature deformation caused by imprinting with currently available PDMS lithography stamps. The imprint lithography stamp includes a glass backing plate, which provides rigidity to the stamp. The glass backing plate includes a plurality of through-holes, portions of the stamp body extend into the through-holes, which helps bond the stamp plate to the backing plate. An injection mold design for forming the imprint lithography stamp is also provided. The injection mold includes the backing plate as an insert. The injection mold further includes a stamp master plate, which contains the negative pattern of the protrusions formed on the imprint lithography stamp. The stamp master plate is fabricated from PDMS or nickel, which easily demolds from the FEP stamp body.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

The present disclosure describes imprint lithography stamps, methods of manufacturing imprint lithography stamps, and methods of using imprint lithography stamps. Certain details are set forth in the description and in FIGS. 1-7F to provide a thorough understanding of various implementations of the disclosure. Other details describing well-known structures and systems often associated with imprint lithography stamps, injection molding processes for forming imprint lithography stamps, and methods of using imprint lithography stamps to pattern polymer materials are not set forth in the present disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described herein.

While the foregoing is directed to implementations of the present disclosure, other and further implementations of the disclosure may be devised without departing from the basic scope thereof, and the scope thereof is determined by the claims that follow.

The invention claimed is:

1. A method for forming a redistribution layer, comprising:
depositing a polymer layer onto a surface of a reconstituted substrate, the reconstituted substrate comprising a plurality of devices disposed in a molding compound;

heating the polymer layer to from about 120° C. to about 150° C.; and physically imprinting a pattern into the polymer layer with an imprint lithography stamp to form a plurality of openings therein, wherein the imprint lithography stamp comprises fluorinated ethylene propylene (FEP), the imprint lithography stamp further comprising:
- a backing plate, comprising:
  - a front surface; and
  - a backside surface opposite the front surface, wherein the backing plate has a plurality of through-holes extending from the front surface to the backside surface; and
- a stamp body, comprising:
  - a patterned surface having a plurality of protrusions extending from the stamp body; and
  - a back surface opposite the patterned surface, wherein the back surface contacts the front surface of the backing plate and a portion of the stamp body extends from the back surface of the stamp body into the plurality of through-holes formed in the backing plate.

2. The method of claim 1, further comprising heating the polymer layer to a temperature in a range from about 180° C. to about 200° C. after imprinting the pattern.

3. The method of claim 1, wherein the polymer layer comprises a polyimide or an Ajinomoto Build-up Film.

4. The method of claim 1, wherein imprinting the pattern into the polymer layer comprises heating the imprint lithography stamp to a temperature in a range from about 100° C. to about 150° C.

5. The method of claim 4, wherein imprinting the pattern into the polymer layer takes place in an environment at less than about atmospheric pressure.

6. The method of claim 4, wherein imprinting the pattern into the polymer layer comprises exposing the polymer layer to UV radiation through the imprint lithography stamp.

7. The method of claim 1, wherein the reconstituted substrate further comprises a previously formed redistribution layer disposed on the plurality of devices, the previously formed redistribution layer comprising a dielectric polymer layer having a plurality of metal interconnects disposed therein, wherein the surface of the previously formed redistribution layer has been planarized to remove portions of a seed layer and a metal layer therefrom.

8. The method of claim 1, wherein the backing plate comprises glass, ceramic, fiberglass, chrome, stainless steel, or nickel.

9. The method of claim 1, wherein at least one protrusion of the plurality of protrusions has a diameter in a range from about 1 micrometer to about 20 micrometers.

10. The method of claim 1, wherein at least one through-hole of the plurality of through-holes has a diameter in a range from about 0.5 millimeters to about 1 millimeter.

11. The method of claim 1, wherein an aspect ratio of at least one protrusion of the plurality of protrusions is greater than one.

12. The method of claim 1, wherein the stamp body has a thickness measured from the patterned surface to the back surface of from about 0.1 millimeters to about 2 millimeters.

13. A method for forming a redistribution layer, comprising:
depositing a polymer layer onto a surface of a reconstituted substrate, the reconstituted substrate comprising a plurality of devices disposed in a molding compound, the reconstituted substrate further comprising a previously formed redistribution layer disposed on the plurality of devices.

heating the polymer layer to from about 120° C. to about 150° C.; and physically imprinting a pattern into the polymer layer, at a pressure of less than atmospheric pressure, with an imprint lithography stamp to form a plurality of openings therein, wherein the imprint lithography stamp comprises fluorinated ethylene propylene (FEP), the imprint lithography stamp further comprising:
- a backing plate, comprising:
  - a front surface; and
  - a backside surface opposite the front surface, wherein the backing plate has a plurality of through-holes extending from the front surface to the backside surface; and
- a stamp body, comprising:
  - a patterned surface having a plurality of protrusions extending from the stamp body; and
  - a back surface opposite the patterned surface, wherein the back surface contacts the front surface of the backing plate and a portion of the stamp body extends from the back surface of the stamp body into the plurality of through-holes formed in the backing plate.

14. The method of claim 13, wherein the previously formed redistribution layer comprises a dielectric polymer layer having a plurality of metal interconnects disposed therein, wherein the surface of the previously formed redistribution layer has been planarized to remove portions of a seed layer and a metal layer therefrom.

15. The method of claim 13, further comprising heating the polymer layer to a temperature in a range from about 180° C. to about 200° C. after imprinting the pattern.

16. The method of claim 13, wherein the polymer layer comprises a polyimide or an Ajinomoto Build-up Film.

17. The method of claim 13, wherein imprinting the pattern into the polymer layer comprises:
heating the imprint lithography stamp to a temperature in a range from about 100° C. to about 150° C.; and
exposing the polymer layer to UV radiation through the imprint lithography stamp.

18. A method for forming a redistribution layer, comprising:
depositing a polymer layer onto a surface of a reconstituted substrate, the reconstituted substrate comprising a plurality of devices disposed in a molding compound;
heating the polymer layer to from about 120° C. to about 150° C.; and
physically imprinting a pattern into the polymer layer with an imprint lithography stamp to form a plurality of openings therein, wherein imprinting the pattern into the polymer layer comprises exposing the polymer layer to UV radiation through the imprint lithography stamp, the imprint lithography stamp comprising fluorinated ethylene propylene (FEP), the imprint lithography stamp further comprising:
- a backing plate, comprising:
  - a front surface; and
  - a backside surface opposite the front surface, wherein the backing plate has a plurality of through-holes extending from the front surface to the backside surface; and
- a stamp body, comprising:
  - a patterned surface having a plurality of protrusions extending from the stamp body; and a back surface opposite the patterned surface, wherein the back surface contacts the front surface of the backing plate and a portion of the stamp body extends from the back surface of the stamp body into the plurality of through-holes formed in the backing plate.

19. The method of claim 18, wherein the reconstituted substrate further comprises a previously formed redistribution layer disposed on the plurality of devices, the previously formed redistribution layer comprising a dielectric polymer layer having a plurality of metal interconnects disposed therein, wherein the surface of the previously formed redistribution layer has been planarized to remove portions of a seed layer and a metal layer therefrom.

20. The method of claim 19, wherein:
- at least one protrusion of the plurality of protrusions has a diameter in a range from about 1 micrometer to about 20 micrometers;
- at least one through-hole of the plurality of through-holes has a diameter in a range from about 0.5 millimeters to about 1 millimeter; and
- an aspect ratio of the at least one protrusion of the plurality of protrusions is greater than one.

* * * * *